United States Patent [19]

Cannella

[11] Patent Number: 4,544,798
[45] Date of Patent: Oct. 1, 1985

[54] PHOTOVOLTAIC PANEL HAVING ENHANCED CONVERSION EFFICIENCY STABILITY

[75] Inventor: Vincent D. Cannella, Detroit, Mich.
[73] Assignee: Sovonics Solar Systems, Solon, Ohio
[21] Appl. No.: 636,172
[22] Filed: Jul. 31, 1984

Related U.S. Application Data

[63] Continuation of Ser. No. 450,920, Dec. 20, 1982, abandoned.

[51] Int. Cl.[4] ............................................. H01L 31/04
[52] U.S. Cl. .................................... 136/251; 136/258; 136/259
[58] Field of Search ....... 136/246, 248, 251, 258 AM, 136/259

[56] References Cited

U.S. PATENT DOCUMENTS

| | | | |
|---|---|---|---|
| 2,888,007 | 5/1959 | Tabor | 126/417 |
| 3,597,281 | 8/1971 | Webb | 136/245 |
| 3,841,302 | 10/1974 | Falbel | 126/425 |
| 3,866,285 | 2/1975 | Clark | 29/157 R |
| 4,095,997 | 6/1978 | Griffiths | 136/248 |
| 4,326,012 | 4/1982 | Charlton | 429/9 |
| 4,334,120 | 6/1982 | Yamano et al. | 136/248 |

FOREIGN PATENT DOCUMENTS

| | | | |
|---|---|---|---|
| 2832475 | 2/1980 | Fed. Rep. of Germany | 136/251 |
| 2950274 | 6/1981 | Fed. Rep. of Germany | 136/246 |
| 56-69874 | 6/1981 | Japan | 136/251 |
| 57-1263 | 1/1982 | Japan | 136/251 |

OTHER PUBLICATIONS

H. S. Vilal et al., "Temperature Effects & Degradation Mechanisms of P-I-N Thin Film Si:H Solar Cells", Conf. Record, 17th IEEE Photovoltaic Specialists Conf., (1984), pp. 359-363.

Primary Examiner—Aaron Weisstuch

[57] ABSTRACT

A photovoltaic panel for converting light into electrical energy has enhanced energy conversion efficiency stability. The panel includes a photovoltaic device having an active region formed from a semiconductor material which exhibits an energy conversion efficiency stability directly related to the operating temperature of the device. The panel also includes means for maintaining the operating temperature of the device upon exposure to light at an elevated temperature above the ambient temperature external to the device. The active region semiconductor material is preferably an amorphous semiconductor alloy such as, for example, an amorphous silicon alloy. The operating temperature elevating means can include a thermal insulating material such as glass wool, styrofoam, or cork applied to the back side of the device to minimize heat conduction from the device. The panel can also include an enclosure for enclosing the device having a transparent cover overlying the device to seal the enclosure and provide a still air space adjacent the device. The panel is thereby arranged to maintain the operating temperature of the device at a temperature which is from about twenty degrees Centigrade to about one hundred and fifty degrees Centigrade above the ambient temperature external to the device.

14 Claims, 3 Drawing Figures

PHOTOVOLTAIC PANEL HAVING ENHANCED CONVERSION EFFICIENCY STABILITY

This is a continuation of application Ser. No. 450,920 filed Dec. 20, 1982, now abandoned.

FIELD OF THE INVENTION

This invention relates to a photovoltaic panel having enhanced energy conversion efficiency stability. The invention more particularly relates to such a photovoltaic panel including at least one photovoltaic device having at least one active region formed from an amorphous semiconductor alloy and operating temperature elevating means which maintains the operating temperature of the device at an elevated temperature above the ambient temperature external to the enclosure.

BACKGROUND OF THE INVENTION

This invention relates to an improved photovoltaic panel which converts light energy into electrical energy and which exhibits enhanced energy conversion efficiency stability. The device is preferably formed from amorphous-silicon alloys which have improved stability at elevated operating temperatures.

Recently, considerable efforts have been made to develop systems for depositing amorphous semiconductor alloys, each of which can encompass relatively large areas, and which can be doped to form p-type and n-type materials for the production of p-i-n and other type devices which are, in operation in photovoltaic and other applications substantially equivalent to their crystalline counterparts.

It is now possible to prepare amorphous silicon alloys by glow discharge techniques that have (1) acceptable concentrations of localized states in the energy gaps thereof, and (2) provide high quality electronic properties. One such technique is fully described in U.S. Pat. No. 4,226,898, Amorphous Semiconductors Equivalent To Crystalline Semiconductors, issued in the names of Stanford R. Ovshinsky and Arun Madan on Oct. 7, 1980 and by vapor deposition, as fully described in U.S. Pat. No. 4,217,374, issued in the names of Stanford R. Ovshinsky and Masatsugu Izu on Aug. 12, 1980, under the same title. As disclosed in these patents, fluorine introduced into the amorphous silicon semiconductor operates to substantially reduce the density of the localized defect states therein and facilitates the addition of other alloying materials, such as germanium.

The concept of utilizing multiple cells to enhance photovoltaic device efficiency was discussed at least as early as 1955 by E. D. Jackson in U.S. Pat. No. 2,949,498 issued Aug. 16, 1960. The multiple cell structures therein discussed utilized p-n junction crystalline semiconductor devices. Essentially, the concept is directed to utilizing different band gap devices to more efficiently collect various portions of the solar spectrum and to increase open circuit voltage (Voc). The tandem cell device has two or more cells with the light directed serially through each cell, with a large band gap material followed by one or more smaller band gap materials to absorb the light passed through the preceeding cell or layer.

It is of great commercial importance to be able to mass produce photovoltaic devices. Unlike crystalline silicon, which is limited to batch processing for the manufacture of solar cells, amorphous silicon alloys can now be deposited in multiple layers over large area substrates to form solar cells in a high volume, continuous processing system. Continuous processing systems of this kind are disclosed, for the following patents and example, in the following patents and pending patent applications: U.S. Pat. No. 4,400,409 for A Method Of Making P-Doped Silicon Films And Devices Made Therefrom: Ser. No. 244,386, filed Mar. 16, 1981 for Continuous Systems For Depositing Amorphous Semiconductor Material; U.S. Pat. No. 4,410,558 for Continuous Amorphous Solar Cell Production System; U.S. Pat. No. 4,438,723 for Multiple Chamber Deposition And Isolation System And Method; and U.S. Pat. No. 4,492,181 for Method and Apparatus For Continuously Producing Tandem Amorphous Photovoltaic Cells. As disclosed in these applications a substrate formed from stainless steel, for example, may be continuously advanced through a succession of deposition chambers, wherein each chamber is dedicated to the deposition of a specific material.

In making a solar cell of p-i-n type configuration, a single deposition chamber system can be used for batch processing or preferably, a multiple chamber system can be used wherein a first chamber is used for depositing a p-type amorphous silicon alloy, a second chamber is used for depositing an intrinsic amorphous silicon alloy, and a third chamber is used for depositing an n-type amorphous silicon alloy. Since each deposited alloy, and especially the intrinsic alloy must be of high purity, the deposition environment in the intrinsic deposition chamber is preferably isolated from undesirable doping constituents within the other chambers to prevent the diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

In the previously mentioned patent applications deposition of the amorphous silicon alloy materials onto the large area continuous substrate is accomplished by glow discharge decomposition of the process gases. Among these processes, radio frequency energy glow discharge processes have been found suitable for the continuous production of photovoltaic devices. Also a new and improved process for making amorphous semiconductor alloys and devices has recently been discovered. This process is disclosed in copending application Ser. No. 423,424, filed Sep. 24, 1982 for Method Of Making Amorphous Semiconductor Alloys And Devices Using Microwave Energy. This process utilizes microwave energy to decompose the reaction gases to cause the deposition of improved amorphous semiconductor materials. This process provides substantially increased deposition rates and reaction gas feed stock utilization. Microwave glow discharge processes can also be utilized in high volume mass production of photovoltaic devices as disclosed in copending application Ser. No. 441,280, filed Nov. 12, 1982, for An Improved Apparatus For The Manufacture Of Photovoltaic Devices and to make layered structures as also disclosed in copending application Ser. No. 435,068, filed Oct. 18, 1982 now abandoned, for Method And Apparatus For Making Layered Amorphous Semiconductor Alloys Using Microwave Energy.

It has recently been determined through laboratory experiments that photovoltaic devices having at least one active region formed from an amorphous semiconductor alloy exhibit enhanced energy conversion efficiency stability when operated at elevated temperatures as opposed to the stability of such devices when operated at low ambient temperatures. During the operation of such a photovoltaic device a degradation process can take place wherein over a period of time of operation, the energy conversion efficiency decreases to a point where the efficiency becomes virtually constant. It has been found that the rate of decrease occurs at a slower rate and stabilizes at a significantly higher level when such devices are operated at elevated temperatures above the normal ambient operating temperature.

It is believed that the enhanced stability is obtained because a competing process takes place within such devices when operated at elevated temperatures. This process is an annealing process. Devices which have been operated at a low ambient operating temperature for a sufficient period of time to exhibit a substantially decreased energy conversion efficiency, when annealed at a temperature of, for example, 150° C. for about one hour, exhibit an energy conversion efficiency substantially equal to their initial efficiency. During degradation, a decrease in short circuit current (Jsc) and fill factor (ff) is observed while the open circuit voltage (Voc) remains substantially unchanged. This results in an overall decrease in efficiency. However, after annealing, both Jsc and ff return to their original values.

It is therefore postulated from the foregoing that photovoltaic devices which include amorphous semiconductor alloys when operated at elevated temperatures experience this annealing process in competition with the degradation process. As a result, such devices exhibit enhanced stability when operated at elevated temperatures both in terms of the rate of decrease in efficiency and the stabilized efficiency level.

It is in view of this important discovery that the present invention provides a photovoltaic panel including operating temperature elevating means which maintains the operating temperature of the device at an elevated temperature above the ambient temperature external to the enclosure. As a result, a photovoltaic panel having enhanced energy conversion efficiency stability is obtained.

SUMMARY OF THE INVENTION

The invention provides a photovoltaic panel for converting light into electrical energy having enhanced energy conversion efficiency stability. The panel includes at least one photovoltaic device having an active region formed from a semiconductor material which exhibits an energy conversion efficiency stability directly related to the operating temperature of the device. The panel also includes operating temperature elevating means for maintaining the operating temperature of the device at an elevated temperature upon exposure to light wherein the elevated temperature is above the ambient temperature external to the enclosure. The active region semiconductor material is preferably an amorphous semiconductor alloy such as, for example, an amorphous silicon alloy. The operating temperature elevating means can include a thermal insulating material applied to the back side of the device to maintain the operating temperature of the device at an elevated temperature of about twenty degrees Centigrade to about one hundred and fifty degrees Centigrade above the ambient temperature external to the device.

The panel can also include an enclosure having a thermal insulating material such as glass wool, styrofoam, or cork to minimize heat conduction from the device. The enclosure can also include a transparent cover overlying the device to seal the enclosure and provide a still air space adjacent the device within the enclosure.

DETAILED DESCRIPTION OF THE DRAWINGS

I. The Photovoltaic Cell

Figure 1:
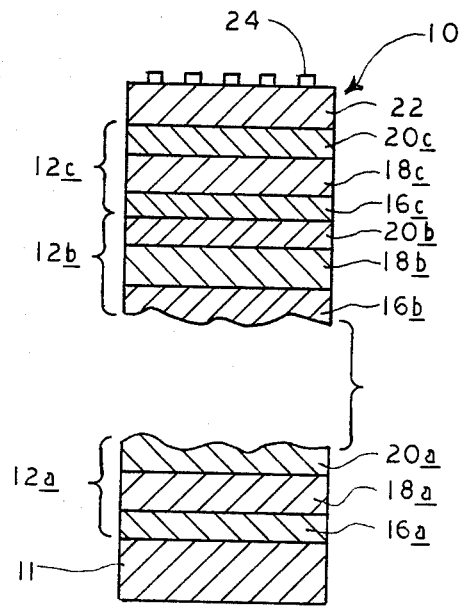
FIG. 1 is a fragmentary cross-sectional view of a photovoltaic device of the type including at least one active region formed from an amorphous semiconductor alloy which can be utilized to advantage within a photovoltaic panel embodying the present invention.

Referring now to the drawings and particularly to FIG. 1 a photovoltaic device formed of a plurality of successive p-i-n layers, including at least one active region formed from an amorphous semiconductor alloy is shown generally by the numeral 10. It is for this type of photovoltaic device, wherein the active regions are formed from amorphous semiconductor alloy layers that the photovoltaic panels of the present invention are most particularly applicable.

More particularly, FIG. 1 shows a p-i-n type photovoltaic device such as a solar cell made up of individual p-i-n type cells 12a, 12b, and 12c. Below the lower most cell 12a is a substrate 11 which may be preferably formed from a conductive metallic material such as stainless steel, aluminum, tantalum, molybdenum, or chrome. The substrate can also include a nonconductive base such as glass having a layer or layers of conductive material deposited thereon. For purposes of this application, the term "substrate" shall include both rigid and flexible substrates and also any conductive layers added thereto by preliminary processing.

Each of the cells 12a, 12b, and 12c is fabricated with an amorphous alloy semiconductor region or body containing at least a silicon alloy. Each of the alloy bodies includes an n-type conductivity region or layer 20a 20b and 20c; an active intrinsic region or layer 18a 18b and 18c and a ptype conductivity region or layer 16a, 16b and 16c. As illustrated, cell 12b is an intermediate cell and as indicated in FIG. 1, additional intermediate cells may be stacked atop the illustrated cells without departing from the spirit or scope of the present invention. Also, although a tandem p-i-n cell is illustrated, the invention may also be applied to single p-i-n cells or single or multiple n-i-p cells as well.

Following the deposition of the semiconductor alloy layers a further deposition process may be performed either in a separate environment or as a part of a continuous process. In this step a transparent or semitransparent layer 22 of conductive light transmissive material such as a TCO (transparent conductive oxide) of for example a compound of indium, tin, and oxygen (ITO) is added. An electrode grid 24 may be added to the device where the cell is of a sufficiently large area, or if the conductivity of the TCO layer 22 is insufficient. The grid 24 shortens the carrier path and increases the collection efficiency.

To form the photovoltaic cell 10 illustrated in FIG. 1, reference can be made to the aforementioned U.S. Pat. No. 4,492,181, for Method And Apparatus For Continuously Producing Tandem Amorphous Photovoltaic Cells, which patent is incorporated herein by reference.

II. The Photovoltaic Panel

Figure 2:
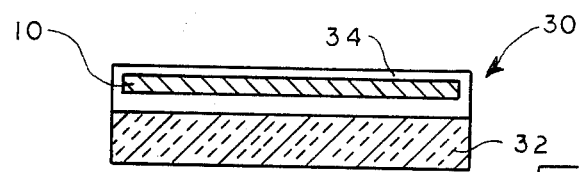
FIG. 2 is a cross-sectional side view of a photovoltaic panel embodying the present invention.

Referring now to FIG. 2, there is illustrated a photovoltaic panel 30 embodying the present invention. The panel 30 includes a photovoltaic device such as the photovoltaic device 10 illustrated in FIG. 1 a base or backing 32 and an encapsulant 34 encapsulating the device 10.

The base or backing 32 underlies the device 10 and is adhered to the encapsulant 34 in broad area surface contact therewith. The backing 32 is formed from a thermal insulating material having a thermal conductivity of less than $10^{-3}$ W/cm° C. such as, for example, glass wool, styrofoam, or cork.

The encapsulant 34 is formed from transparent material such as Tedlar. The encapsulant totally encapsulates the device 10 to protect the device from the external environment. Because the encapsulant is transparent the photon light energy is permitted to be absorbed in the active region or regions of the device for creating the charge carriers which are then collected as electrical current.

In operation when the panel 30 is exposed to light, the device absorbs the light energy to produce electrical energy and heat. The heat generated by the device is restricted from being conducted away from the device by the thermal insulating backing 32. As a result, the panel is arranged to permit the device 10 to heat up during operation and maintain the device at an elevated operating temperature above the ambient temperature external to the panel. As a result, and as previously mentioned, the elevated operating temperature permits an annealing process to take place within the device 10 during operation which competes with the degradation process to reduce the energy conversion efficiency degradation rate and establish a substantially higher stabilized energy conversion efficiency than would be possible if the device were permitted to operate at a normal ambient operating temperature.

Figure 3:
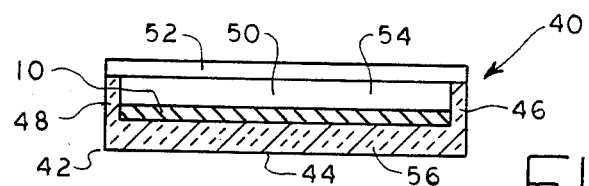
FIG. 3 is a cross-sectional side view of another photovoltaic panel embodying the present invention.

Referring now to FIG. 3, it illustrates another photovoltaic panel 40 embodying the present invention. The panel 40 includes the photovoltaic device 10 and an enclosure 42 including a bottom wall 44, four sidewalls 46, 48, 50, and one opposite sidewall not shown in the figure, and a transparent cover 52.

Then enclosure bottom wall 44 and the sidewalls 46, 48, and 50 are formed from or contain a thermal insulating material 56 such as glass wool, styrofoam, or cork. The sidewalls and bottom wall are dimensioned for receiving the device 10 therein with the back surface or substrate of the device in intimate surface contact with the thermal insulating material 56 and the side edges of the device in contact with the sidewalls. The sidewalls extend from the bottom wall by a distance to permit a still air space 54 to be formed between the front surface of the device and the transparent cover 52 which bridges across the sidewall to enclose the device. The transparent cover 52 can be formed from glass or other similar rigid or semi-rigid transparent material and can be adhered to the top surfaces of the sidewalls by a suitable adhesive such as epoxy.

In operation, light energy passing through the transparent cover 52 strikes the front surface of the device 10. The device 10 absorbs the light and produces electrical energy and heat. The heat is restricted from being conducted away from the device by the thermal insulating bottom and sidewalls of the enclosure and by the still air space 54 between the device 10 and the transparent cover 52. As a result, the device is permitted to heat up during operation to an elevated temperature. As previously mentioned, the elevated operating temperature of the device 10 results in improved energy conversion efficiency stability be obtained.

Photovoltaic panels of the type disclosed herein are capable of maintaining the operating temperature of the photovoltaic devices contained therein at temperatures of about twenty degrees Centigrade to about one hundred and fifty degrees Centigrade above the ambient temperature external to the panels. At these elevated temperatures the annealing process is permitted to take place to compete with the degradation process to result in improved energy conversion efficiency stability.

The alloy regions other than the intrinsic alloy regions can be other than amorphous regions such as polycrystalline regions. (By the term "amorphous" is meant an alloy or material which has long range disorder, although it may have short or intermediate order or even contain at times some crystalline inclusions.)

Modifications and variations of the present invention are possible in light of the above teachings. For example, the amorphous semiconductor materials of the photovoltaic devices can be formed by glow discharge or other techniques from gases containing semiconductor containing compounds such as silane ($SiH_4$) or silicon tetrafluoride ($SiF_4$) or combinations thereof with or without added hydrogen. Furthermore, these or other semiconductor alloys which can degrade at lower operating temperatures can be utilized in accordance with the invention. It is therefore, to be understood that within the scope of the appended claims the invention may be practiced otherwise than as specifically described.

What is claimed and desired to be secured by Letters Patent of the United States is:

1. A photovoltaic panel for converting light into electrical energy having enhanced energy conversion efficiency stability, comprising;
    at least one photovoltaic device, formed from amorphous semiconductor alloys, that exhibits an energy conversion efficiency stability that increases at elevated operating temperatures of the device, said device including a conductive substrate upon which said amorphous semiconductor alloys are formed; and
    an enclosure housing said device for elevating the operating temperature of said photovoltaic device, said enclosure including means for preventing loss of heat from the interior of said enclosure and from said device for continuously maintaining the operating temperature of said device upon exposure to light at a substantially elevated temperature above the ambient temperature external to said enclosure.

2. A photovoltaic panel as defined in claim 1 wherein said means for preventing loss of heat includes means for maintaining said device at an operating temperature of about twenty (20) to about one hundred fifty (150) degrees Centigrade above said ambient temperature 3. A photovoltaic panel as defined in claim 1 wherein said means for preventing loss of heat includes a thermal insulating backing beneath said device.

4. A photovoltaic panel as defined in claim 3 further including an encapsulant formed from transparent material for encapsulating said device.

5. A photovoltaic panel as defined in claim 4 wherein said transparent material is a plastic material.

6. A photovoltaic panel as defined in claim 3 wherein said thermal insulating backing is formed from glass wool.

7. A photovoltaic panel as defined in claim 3 wherein said thermal insulating backing is formed from styrofoam.

8. A photovoltaic panel as defined in claim 3 wherein said thermal insulating backing is formed from cork.

9. A photovoltaic panel as defined in claim 1 wherein said enclosure includes a bottom wall and sidewalls dimensioned for receiving said device, and wherein said means for preventing loss of heat includes thermal insulating material in contact with the back surface of said device.

10. A photovoltaic panel as defined in claim 9 wherein said enclosure further includes a transparent cover overlying said device between said sidewalls for forming a still air space adjacent said device.

11. A photovoltaic panel as defined in claim 10 wherein said transparent cover is formed from glass.

12. A photovoltaic panel as defined in claim 9 wherein said thermal insulating material is formed from glass wool.

13. A photovoltaic panel as defined in claim 9 wherein said thermal insulating material is formed from styrofoam.

14. A photovoltaic panel as defined in claim 9 wherein said thermal insulating material is formed from cork.

* * * * *